(12) United States Patent
Lee et al.

(10) Patent No.: US 12,185,485 B2
(45) Date of Patent: Dec. 31, 2024

(54) DISPLAY DEVICE AND METHOD FOR MANUFACTURING THE SAME

(71) Applicant: Samsung Display Co., Ltd., Yongin-si (KR)

(72) Inventors: Sangwon Lee, Seoul (KR); Youngsu Kim, Gunpo-si (KR); Jaesuk Yoo, Seoul (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 0 days.

(21) Appl. No.: 17/220,873

(22) Filed: Apr. 1, 2021

(65) Prior Publication Data

US 2021/0337691 A1 Oct. 28, 2021

(30) Foreign Application Priority Data

Apr. 24, 2020 (KR) .................. 10-2020-0050009

(51) Int. Cl.
*H05K 5/03* (2006.01)
*H05K 5/00* (2006.01)
*H05K 5/04* (2006.01)

(52) U.S. Cl.
CPC ............. *H05K 5/03* (2013.01); *H05K 5/0017* (2013.01); *H05K 5/04* (2013.01)

(58) Field of Classification Search
CPC ........... H05K 5/04; H05K 5/0017; H05K 5/03
See application file for complete search history.

(56) References Cited

U.S. PATENT DOCUMENTS

| | | | |
|---|---|---|---|
| 9,983,714 B2 * | 5/2018 | Ahn | G06F 3/0412 |
| 10,020,462 B1 * | 7/2018 | Ai | H10K 50/841 |
| 10,074,824 B2 | 9/2018 | Han et al. | |
| 10,212,811 B1 * | 2/2019 | Zhang | H10K 59/12 |
| 10,270,059 B2 * | 4/2019 | Kim | H10K 50/844 |
| 10,734,469 B2 * | 8/2020 | Song | H10K 59/126 |
| 10,921,857 B2 * | 2/2021 | Kim | G09F 9/301 |
| 11,081,660 B2 * | 8/2021 | Lee | B32B 27/08 |
| 11,329,263 B2 * | 5/2022 | Park | G06F 1/1626 |
| 2013/0148312 A1 * | 6/2013 | Han | H05K 1/028 |
| | | | 361/736 |
| 2017/0098794 A1 * | 4/2017 | Cho | H10K 50/80 |
| 2017/0263887 A1 * | 9/2017 | Han | H10K 77/111 |

(Continued)

FOREIGN PATENT DOCUMENTS

| | | |
|---|---|---|
| KR | 10-2015-0048547 | 5/2015 |
| KR | 10-2018-0036904 | 4/2018 |

(Continued)

*Primary Examiner* — Abhishek M Rathod
(74) *Attorney, Agent, or Firm* — CANTOR COLBURN LLP

(57) ABSTRACT

A display device includes: a display module including a first substantially flat portion, a first curved portion bent from one portion of the first substantially flat portion, and a second substantially flat portion facing the first substantially flat portion in a thickness direction of the first substantially flat portion; and a cover member including a support to support the display module, the support including a first part disposed under the first substantially flat portion, a second part disposed under the second substantially flat portion, and a third part disposed under the first curved portion. The third part of the support has at least one discontinuity.

13 Claims, 12 Drawing Sheets

(56) References Cited

U.S. PATENT DOCUMENTS

| | | | |
|---|---|---|---|
| 2018/0047938 A1* | 2/2018 | Kishimoto | H10K 59/131 |
| 2018/0304575 A1* | 10/2018 | Liu | H10K 77/111 |
| 2019/0107866 A1* | 4/2019 | Han | G06F 1/1637 |
| 2019/0334114 A1* | 10/2019 | Park | H10K 50/8426 |
| 2020/0020759 A1* | 1/2020 | Song | H04M 1/0269 |
| 2020/0051881 A1* | 2/2020 | Park | B32B 3/04 |
| 2020/0166970 A1* | 5/2020 | Yeom | G06F 1/1618 |
| 2020/0259127 A1* | 8/2020 | Park | H10K 50/84 |
| 2021/0036257 A1* | 2/2021 | Lee | H10K 50/87 |
| 2021/0118336 A1* | 4/2021 | Jin | G09F 9/301 |
| 2021/0136911 A1* | 5/2021 | Song | H10K 50/844 |
| 2023/0191768 A1* | 6/2023 | Komoda | B32B 38/1866 156/212 |

FOREIGN PATENT DOCUMENTS

| | | |
|---|---|---|
| KR | 10-2018-0062271 | 6/2018 |
| KR | 10-1960274 | 3/2019 |
| KR | 10-2019-0056812 | 5/2019 |
| KR | 10-2019-0069075 | 6/2019 |
| KR | 1020190096850 A | 8/2019 |

\* cited by examiner

DISPLAY DEVICE AND METHOD FOR MANUFACTURING THE SAME

CROSS-REFERENCE TO RELATED APPLICATION

This application claims priority from and the benefit of Korean Patent Application No. 10-2020-0050009, filed on Apr. 24, 2020, which is hereby incorporated by reference for all purposes as if fully set forth herein.

BACKGROUND

Field

The invention relates generally to a display device, and more particularly, to a display device capable of displaying an image through various display surfaces and a method for manufacturing same.

Discussion of the Background

Various display devices used for multi-media devices such as televisions, mobile phones, tablet computers, navigations, and game consoles are being developed. The display device may include a display module displaying an image and detecting an external input, a polarizing layer disposed on the display panel, and a cover window. The display module may include a display panel for displaying an image and an input detection unit for detecting external input.

Recently, in addition to flat panel display devices, various types of display devices have been developed. For example, various flexible display devices such as curved display devices, bendable display devices, foldable display devices, rollable display devices, and stretchable display devices have been developed. Such a display device may display an image through each of the front, back, and side surfaces.

The above information disclosed in this Background section is only for understanding of the background of the inventive concepts, and, therefore, it may contain information that does not constitute prior art.

SUMMARY

Display devices constructed according to the principles and embodiments of the invention and methods for manufacturing the same provide improved reliability. For example, the display device may include a display module having a curved shape and a cover member disposed under the display module. The cover member may include a portion with at least one discontinuity, such as a plurality of holes, corresponding to and/or overlapping a portion of the display module having the curved shape. In processes of manufacturing display devices, the cover member may be bent and/or folded more easily with higher reliability at the due to the at least one discontinuity.

Additional features of the inventive concepts will be set forth in the description which follows, and in part will be apparent from the description, or may be learned by practice of the inventive concepts.

According to one aspect to the invention, a display device includes: a display module including a first substantially flat portion, a first curved portion bent from one portion of the first substantially flat portion, and a second substantially flat portion facing the first substantially flat portion in a thickness direction of the first substantially flat portion; and a cover member including a support to support the display module, the support including a first part disposed under the first substantially flat portion, a second part disposed under the second substantially flat portion, and a third part disposed under the first curved portion. The third part of the support has at least one discontinuity.

The at least one discontinuity may include at least one hole at least partially penetrating the third part of the support.

The support may include a support plate, and the third part of the support plate may have a curved shape corresponding to the first curved portion.

The first substantially flat portion may have a larger area than the second substantially flat portion.

The cover member may include a cover layer including: an adhesive layer disposed between the support and the display module; a cushion layer disposed between the adhesive layer and the support; a protective layer disposed between the cushion layer and the support; and a heat radiation layer disposed between the protective plate and the support.

The support may be spaced apart from the display module at a greater distance than any of the layers of the cover layer.

The support may include a metal material.

Each of the first substantially flat portion, the second substantially flat portion, and the first curved portion may include a display area to display an image and a peripheral area adjacent to the display area.

The display module may further include a second curved portion bent from another portion of the first substantially flat portion and facing the first curved portion in one direction, the support may further include a fourth part disposed under the second curved portion and corresponding to a shape of the second curved portion.

The fourth part of the support may include one or more discontinuities spaced apart from each other.

The first to fourth parts of the support may be integrally formed into a unitary shape.

According to another aspect of the invention, a display device includes: a display module including a first substantially flat portion, a first curved portion bent from one portion of the first substantially flat portion, and a second substantially flat portion facing the first substantially flat portion in a thickness direction of the first substantially flat portion; and a cover member including a support to support the display module, the support including a first part disposed under the first substantially flat portion, a second part disposed under the second substantially flat portion, and a third part disposed under the first curved portion. The support includes an upper surface facing the display module and a lower surface opposite the upper surface, and the lower surface of the support corresponding to the third part has at least one discontinuity.

The support may include a support plate, and the at least one discontinuity may include at least one of a recess having an uneven shape.

The display module may further include a second curved portion bent from another portion of the first substantially flat portion and facing the first curved portion in one direction, the support further may include a fourth part disposed under the second curved portion and corresponding to a shape of the second curved portion, and the lower surface of the support corresponding to the fourth part may have at least one other discontinuity.

Each of the first substantially flat portion, the second substantially flat portion, the first curved portion, and the second curved portion may include a display area to display an image and a peripheral area adjacent to the display area.

The cover member may include a cover layer including: a first adhesive layer disposed between the support and the display module; a cushion layer disposed between the first adhesive layer and the support; a protective layer disposed between the cushion layer and the support; and a heat radiation layer disposed between the protective plate and the support. The support may be most spaced apart from the display module from among the layers f the cover member.

According to still another aspect of the invention, a method of manufacturing a display device includes steps of: providing a cover member including a support having a first substantially flat part and a second substantially flat part facing each other in a thickness direction, and a curved part between one end of the first part and one end of the second part having at least one discontinuity; providing an adhesive layer and a display module to be bonded to the adhesive layer, each of the adhesive layer and the display module having a substantially flat shape; and forming the display module on the cover member such that the display module and the adhesive layer each has a shape corresponding to a shape of the cover member.

The method may further include steps of bonding a window having a shape corresponding to the cover member and the adhesive layer to the display module.

The method may further include steps of forming a window on the adhesive layer by forming the display module, the adhesive layer, and the window on the cover member such that the window has a shape corresponding to the shape of the cover member.

The step of forming the display module on the cover member may include steps of: aligning a portion of the display module with the second substantially flat part of the cover member; coupling the aligned portion of the display module to the second substantially flat part of the cover member; and coupling other portion of the display module to the curved part and the first substantially flat part of the cover member.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention, and together with the description serve to explain the inventive concepts.

DETAILED DESCRIPTION

Figure 1A:
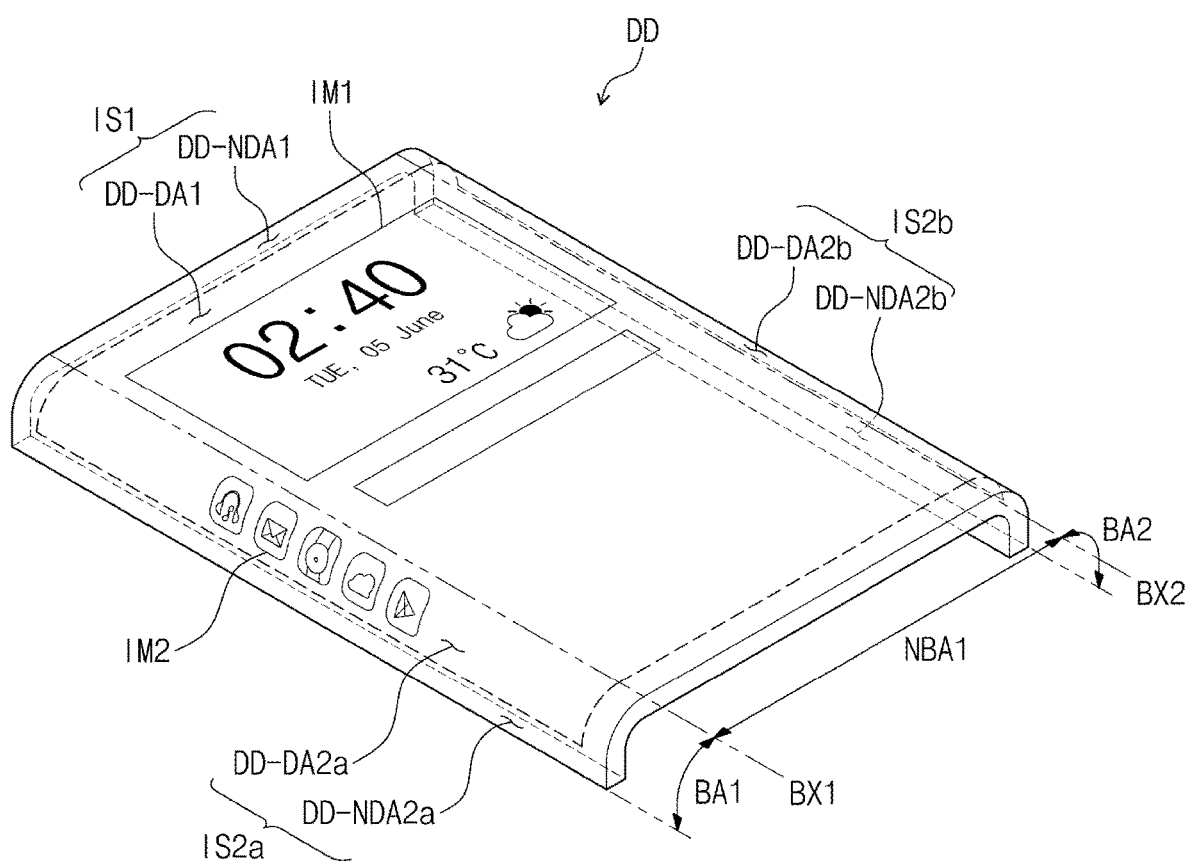
FIG. 1A is a perspective view of an embodiment of a display device constructed according to the principles of the invention.
Figure 1A:
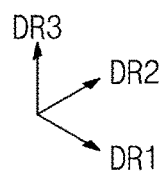

In the following description, for the purposes of explanation, numerous specific details are set forth in order to provide a thorough understanding of various embodiments or implementations of the invention. As used herein "embodiments" and "implementations" are interchangeable words that are non-limiting examples of devices or methods employing one or more of the inventive concepts disclosed herein. It is apparent, however, that various embodiments may be practiced without these specific details or with one or more equivalent arrangements. In other instances, well-known structures and devices are shown in block diagram form in order to avoid unnecessarily obscuring various embodiments. Further, various embodiments may be different, but do not have to be exclusive. For example, specific shapes, configurations, and characteristics of an embodiment may be used or implemented in another embodiment without departing from the inventive concepts.

Unless otherwise specified, the illustrated embodiments are to be understood as providing features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the D1-axis, the D2-axis, and the D3-axis are not limited to three axes of a rectangular coordinate system, such as the x, y, and z-axes, and may be interpreted in a broader sense. For example, the D1-axis, the D2-axis, and the D3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various embodiments are described herein with reference to sectional and/or exploded illustrations that are schematic illustrations of idealized embodiments and/or intermediate structures. As such, variations from the shapes of the illustrations as a result, for example, of manufacturing techniques and/or tolerances, are to be expected. Thus, embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

Figure 1B:
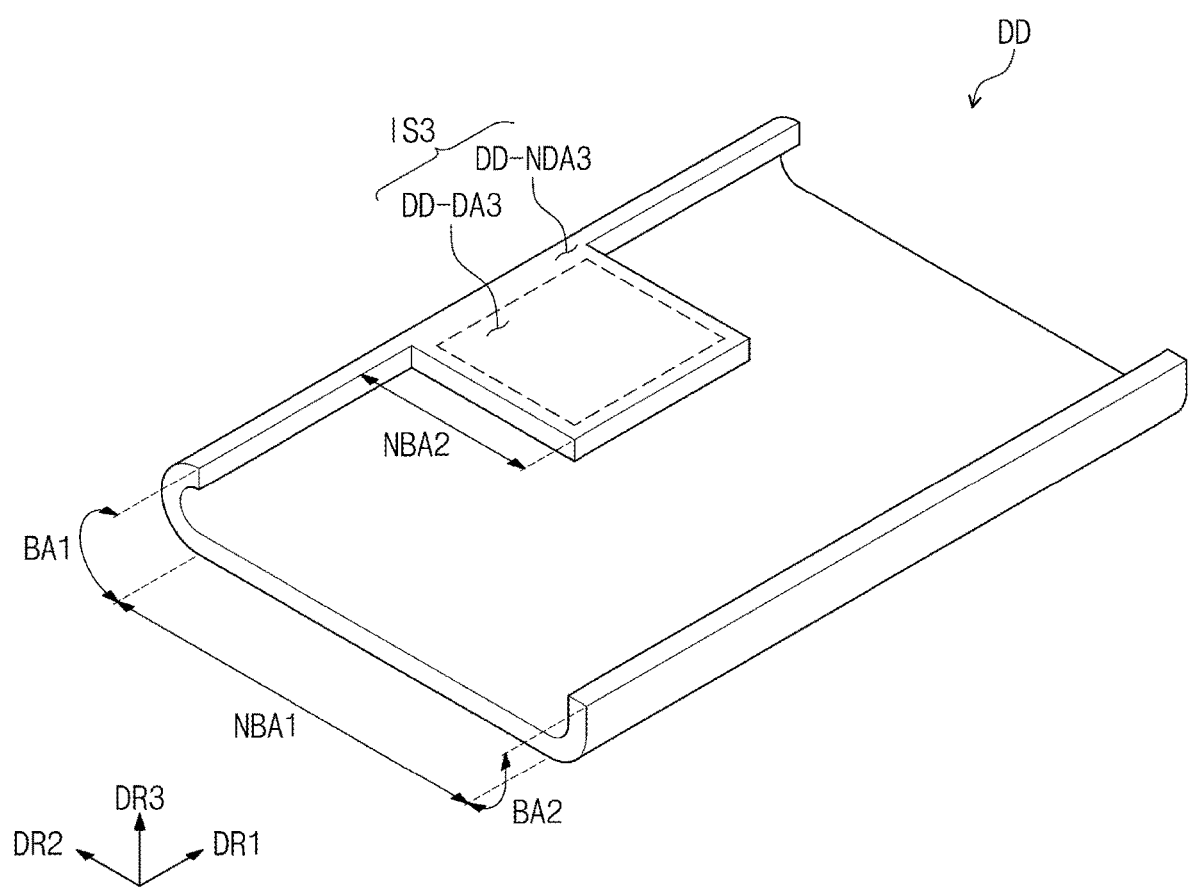
FIG. 1B is a perspective view of the display device of FIG. 1A viewed from a different direction.
Figure 1C:
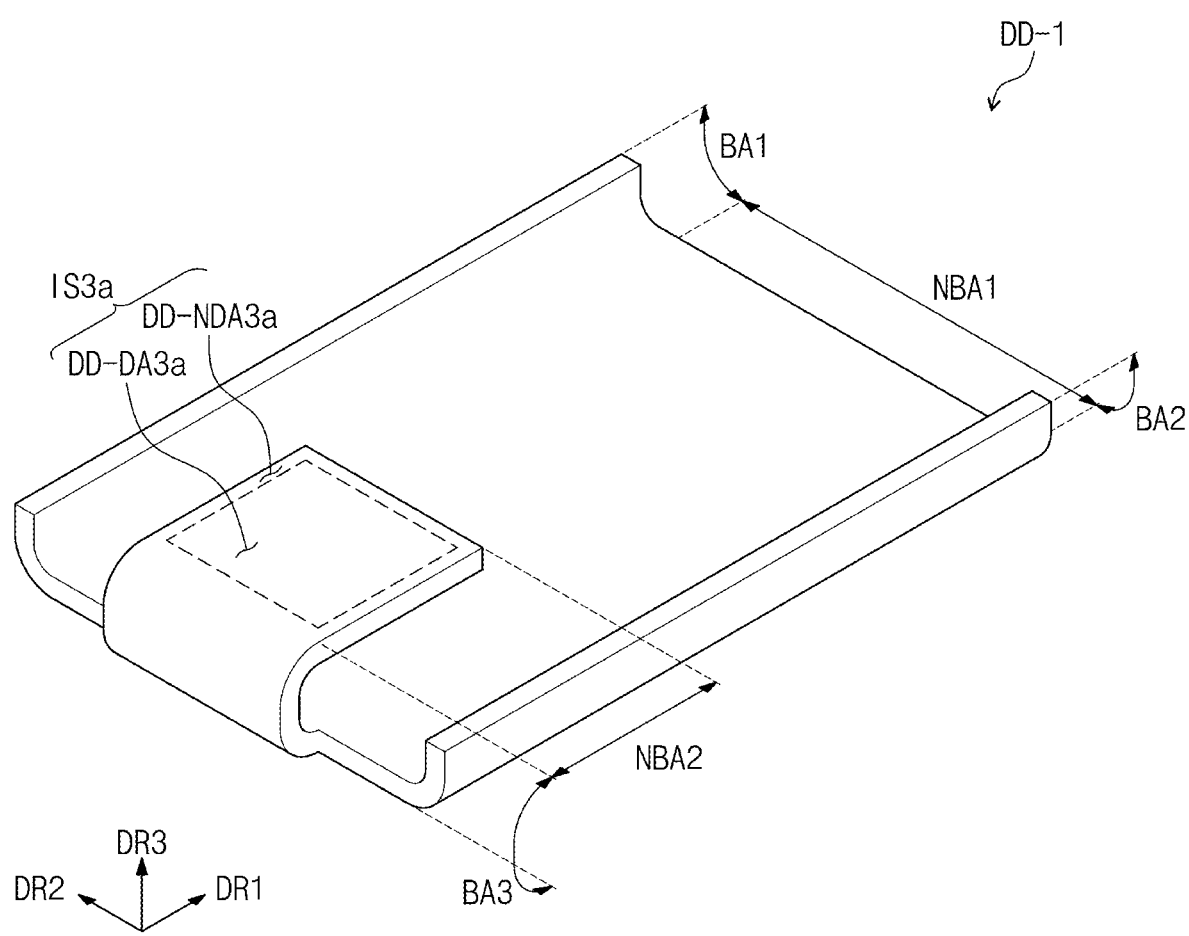
FIG. 1C is a perspective view of another embodiment of a display device constructed according to the principles of the invention.

FIG. 1A is a perspective view of an embodiment of a display device constructed according to the principles of the invention. FIG. 1B is a perspective view of the display device of FIG. 1A viewed from a different direction. FIG. 1C is a perspective view of another embodiment of a display device constructed according to the principles of the invention.

Referring to FIG. 1A, the display device DD may include a first planar area NBA1, a first bending area BA1, and a second bending area BA2. The first bending area BA1 and the second bending area BA2 are bent from the first planar area NBA1. The first bending area BA1 and the second bending area BA2 face each other in the second direction DR2 and may be bent from one end and the other end of the first planar area NBA1, respectively. The first bending area BA1 is bent about the first bending axis BX1, and the second bending area BA2 is bent about the second bending axis BX2. The first planar area NBA1 may correspond to the upper surface of the display device DD, and the first bending area BA1 and the second bending area BA2 may correspond to the side surface of the display device DD.

According to an embodiment, the first planar area NBA1 includes a first display surface IS1, the first bending area BA1 includes a second display surface IS2a, and the second bending area BA2 includes a third display surface IS2b.

The first display surface IS1 includes a first display area DD-DA1 and a first peripheral area DD-NDA1 adjacent to the first display area DD-DA1. Hereinafter, the display area is defined as an area in which an actual image is displayed, and the peripheral area is defined as a non-display area in which an image is not displayed. In addition, the peripheral area may be provided in various colors through a printed layer.

The first planar area NBA1 may be parallel to a surface defined by a first direction DR1 and a second direction DR2. The normal direction of the display device DD is indicated by a third direction DR3. In this specification, the meaning of "viewed on a plane or being on a plane" means that it is viewed in the third direction DR3. The front surface (or the upper surface) and the back surface (or lower surface) of each of the layers or units described below are distinguished by the third direction DR3. However, the directions that the first to third directions DR1, DR2, and DR3 indicate may be spatially relative directions, and may be converted to other directions, for example, opposite directions.

The second display surface IS2a includes a second display area DD-DA2a and a second peripheral area DD-NDA2a adjacent to the second display area DD-DA2a. In the second direction DR2, the second display surface IS2a may be bent from one side of the first display surface IS1 about the first bending axis BX1.

The third display surface IS2b includes a third display area DD-DA2b and a third peripheral area DD-NDA2b adjacent to the third display area DD-DA2b. In the second direction DR2, the third display surface IS2b may be bent from the other side of the first display surface IS1 about the second bending axis BX2.

Each of the first to third display areas DD-DA1, DD-DA2a, and DD-DA2b may display an image. For example, as illustrated in FIG. 1A, the first display area DD-DA1 displays a first image IM1 such as a clock window, and the second display area DD-DA2a displays a second image IM2 such as an emoji. The third display area DD-DA2b may also display a third image. The first to third images may form a single image or be different images separated from each other.

However, embodiments are not limited to this, and images displayed from each of the first to third display areas DD-DA1, DD-DA2a, and DD-DA2b may be connected to display one image.

In addition, while the first to third peripheral areas DD-NDA1, DD-NDA2a, and DD-NDA2b are illustrated through FIG. 1A, at least one of the first to third peripheral areas DD-NDA1, DD-NDA2a, and DD-NDA2b may be omitted or all may be omitted.

Referring to FIG. 1B, the display device DD may further include a second planar area NBA2. The second planar area NBA2 may be spaced apart from the first planar area NBA1 in the third direction DR3, and may face the the first planar area NBA1.

The second planar area NBA2 may have a shape protruding from the first bending area BA1 along the second direction DR2. One end of the first bending area BA1 may be adjacent to the first planar area NBA1, and the other end of the first bending area BA1 may be adjacent to the second planar area NBA2. The first planar area NBA1, the first bending area BA1, the second bending areas BA2, and the second planar area NBA2 may be provided as one integral member.

The second planar area NBA2 includes a fourth display surface IS3. The fourth display surface IS3 of the second planar area NBA2 includes a fourth display area DD-DA3 and a fourth peripheral area DD-NDA3 adjacent to the fourth display area DD-DA3. The fourth peripheral area DD-NDA3 may be omitted.

According to an embodiment, on a plane, the fourth display surface IS3 may have a smaller area than the first display surface IS1. The first display surface IS1 may be viewed through the upper surface of the display device DD, and the fourth display surface IS3 may be viewed through the lower surface of the display device DD. Also, the second display surface IS2a and the third display surface IS2b may be viewed through the side surface of the display device DD.

Referring to FIG. 1C, the display device DD-1 may further include a second planar area NBA2 and a third bending area BA3 compared to the display device DD illustrated in FIGS. 1A and 1B. The third bending area BA3 may be bent from other side of the first planar area NBA1 in the first direction DR1 about a bending axis along the second direction DR2. The third bending area BA3 may include a peripheral area and/or a display area.

The second planar area NBA2 has a shape extending from the third bending area BA3, and may be spaced apart from the first planar area NBA1 in the third direction DR3. In addition, the second planar area NBA2 is parallel to the first planar area NBA1 and may face each other.

The second planar area NBA2 includes a fourth display surface IS3a. The fourth display surface IS3a of the second planar area NBA2 includes a fourth display area DD-DA3a and a fourth peripheral area DD-NDA3a adjacent to the fourth display area DD-DA3. On a plane, the fourth display surface IS3a may have a smaller area than the first display surface IS1.

As such, the display device may include the first planar area NBA1, one or more bending areas such as the first to third bending areas BA1 to BA3 bent from the first planar area NBA1, and a second planar area NBA2 extending from the bending area. The second planar area NBA2 may face the first planar area NBA1.

Figure 2:
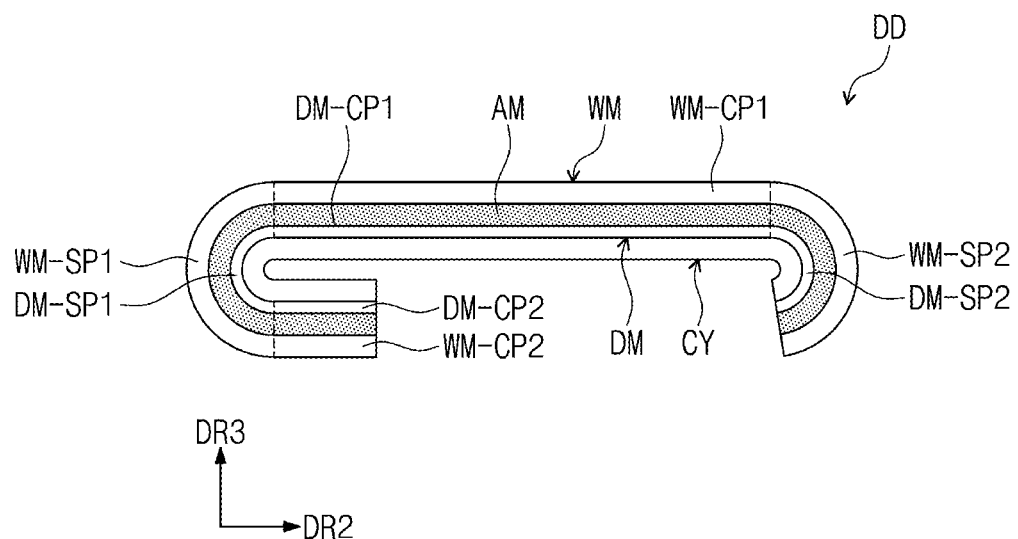
FIG. 2 is a cross-sectional view of the display device shown in FIGS. 1A-B constructed according to the principles of the invention.
Figure 3:
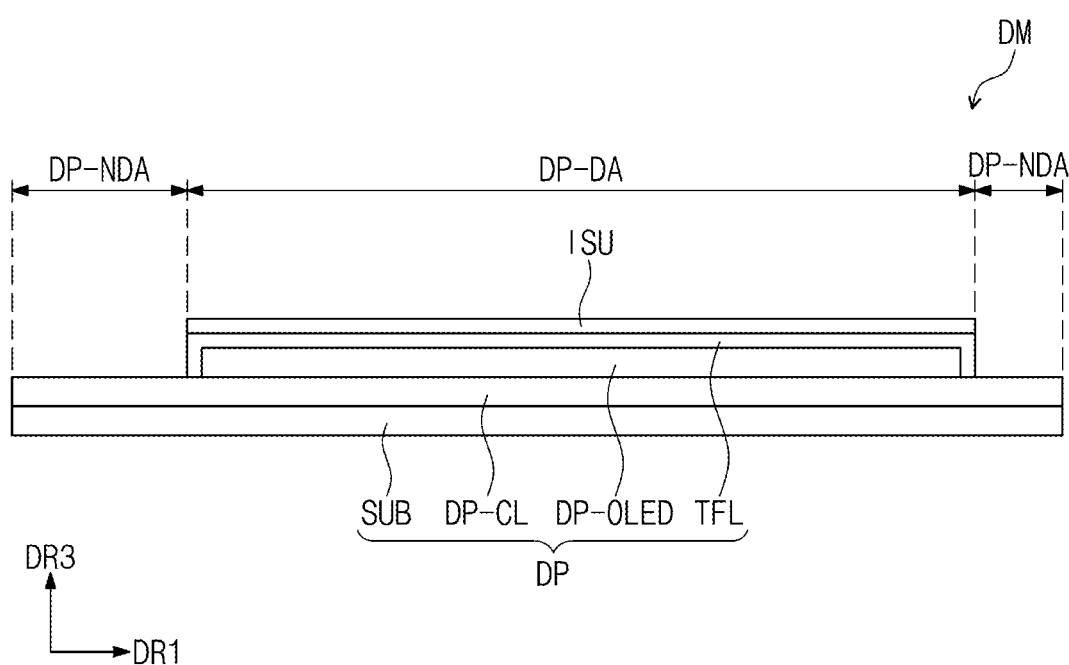
FIG. 3 is a cross-sectional view of an embodiment of the display module of FIG. 2.

FIG. 2 is a cross-sectional view of the display device shown in FIGS. 1A-B constructed according to the principles of the invention. FIG. 3 is a cross-sectional view of an embodiment of the display module of FIG. 2.

Referring to FIG. 2, the display device DD may include a window WM, a display module DM, an adhesive layer AM, and a cover member to support and/or cover the display module, which may be in the form of a cover layer CY.

The window WM corresponds to the uppermost layer of the display device DD, and may correspond to the display surfaces described with reference to FIGS. 1A and 1B. That is, the window WM may be a cover window in which an image is actually viewed from the outside.

The display module DM is disposed under the window WM and may have a shape corresponding to the window WM. The display module DM may output an image or detect an external input. In an embodiment, the display module DM may be provided as a flexible display substrate that may be bent or folded.

In detail, referring to FIG. 3, the display module DM includes a display panel DP and an input detection layer ISU. The display panel DP includes a substrate SUB, a circuit element layer DP-CL disposed on the substrate SUB, a display element layer DP-OLED, and an insulating layer TFL. The type of the display panel is not particularly limited. For example, the display panel may be an organic light emitting display panel or a quantum dot light emitting display panel. The light emitting layer of the organic light emitting display panel includes an organic light emitting material. The light emitting layer of the quantum dot light emitting display panel includes a quantum dot or a quantum rod.

The display panel DP includes a display area DP-DA and a peripheral area DP-NDA. The display area DP-DA of the display panel DP corresponds to the display areas shown in FIGS. 1A and 1B, and the peripheral area DP-NDA corresponds to the peripheral areas shown in FIGS. 1A and 1B.

The substrate SUB may include at least one plastic film. The substrate SUB may include a plastic substrate, a glass substrate, a metal substrate, or an organic/inorganic composite material substrate as a flexible substrate.

The circuit element layer DP-CL includes at least one intermediate insulating layer and circuit elements. The intermediate insulating layer includes at least one intermediate inorganic film and at least one intermediate organic film. The circuit element includes signal lines, a driving circuit of a pixel, and the like.

The display element layer DP-OLED includes at least organic light emitting diodes. The display element layer DP-OLED may further include an organic layer such as a pixel defining layer. According to another embodiment, in case where the display panel is provided as a liquid crystal display panel, the display element layer may be provided as a liquid crystal layer.

The insulating layer TFL seals the display element layer DP-OLED. For example, the insulating layer TFL may be a thin film sealing layer. The insulating layer TFL protects the display element layer DP-OLED from foreign matter such as moisture, oxygen, and dust particles. However, embodiments are not limited, and a sealing substrate may be provided in place of the insulating layer TFL. In this case, the sealing substrate faces the substrate SUB, and the circuit element layer DP-CL and the display element layer DP-OLED may be disposed between the sealing substrate and the substrate SUB.

The input detection layer ISU may be disposed between the window WM and the display panel DP. The input detection layer ISU detects an input applied from the outside. The externally applied input may be provided in various forms. For example, the external input includes various types of external inputs such as a part of the user's body, a stylus pen, light, heat, or pressure. Also, an input that a part of the body, such as a user's hand, touches, as well as a close or adjacent spatial touch (e.g., hovering) may be a form of input.

The input detection layer ISU may be directly disposed on the display panel DP. In this specification, "A configuration is directly disposed on B configuration" means that no adhesive layer is disposed between A configuration and B configuration. In this embodiment, the input detection layer ISU may be manufactured with a display panel DP by a continuous process. However, embodiments are not limited to this process, and the input detection layer ISU is provided as a separate panel, and may be combined with the display panel DP through an adhesive layer. As another example, the input detection layer ISU may be omitted.

In addition, an auxiliary insulating layer may be further disposed between the input detection layer ISU and the insulating layer TFL. For example, the auxiliary insulating layer may be an inorganic layer. In this case, some of the conductive patterns included in the input detection layer ISU may be directly formed on the auxiliary insulating layer.

Referring back to FIG. 2, the adhesive layer AM may be disposed between the window WM and the display module DM. The adhesive layer AM is a double-sided adhesive, and may fix the window WM and the display module DM. For example, the adhesive layer AM may be an Optically Clear Adhesive (OCA) film, an Optically Clear Resin (OCR), or a Pressure Sensitive Adhesive (PSA) film.

According to an embodiment, the window WM includes a first flat part WM-CP1, a second flat part WM-CP2, a first bending part WM-SP1, and a second bending part WM-SP2. The first bending part WM-SP1 and the second bending part WM-SP2 may have shapes bent from one end and the other end of the first flat part WM-CP1, and face each other in the second direction DR2.

As shown in FIG. 2, the first bending part WM-SP1 and the second bending part WM-SP2 may have different shapes. For example, the length of the first bending part WM-SP1 bent from one end of the first flat part WM-CP1 may be longer than the second bending part WM-SP2 bent from the other end of the first flat part WM-CP1. However, embodiments are not limited thereto, and the shapes of the first bending part WM-SP1 and the second bending part WM-SP2 may be symmetrical to each other with respect to the first flat part WM-CP1.

In an embodiment, each of the first bending part WM-SP1 and the second bending part WM-SP2 may include a portion having a tangent surface at an angle of 90 degrees or more with respect to the first flat part WM-CP1. However, embodiments are not limited thereto, and the angle formed by the bending portion and the flat portion of the window WM may be variously modified.

The second flat part WM-CP2 may have a smaller area than the first flat part WM-CP1 on a plane, and may be spaced apart from the first flat part WM-CP1 in the third direction DR3. The second flat part WM-CP2 faces the first flat part WM-CP1 in a substantially parallel position thereto. One end of the first bending part WM-SP1 is adjacent to one end of the first flat part WM-CP1, and the other end of the first bending part WM-SP1 is adjacent to the second flat part WM-CP2.

The first flat part WM-CP1 of the window WM corresponds to the first planar area NBA1 of FIGS. 1A and 1B, and the first bending part WM-SP1 and the second bending part WM-SP2 may respectively correspond to the first bending area BA1 and the second bending area BA2 of FIGS. 1A and 1B. In addition, the second flat part WM-CP2 of the window WM corresponds to the second planar area NBA2 of FIG. 1B. The window WM may be defined as one configuration in which the first flat part WM-CP1, the second flat part WM-CP2, the first bending part WM-SP1, and the second bending part WM-SP2 have an integral shape.

The display module DM includes a first, substantially flat display portion DM-CP1 and a second, substantially flat display portion DM-CP2, a first curved display portion DM-SP1 and a second curved display portion DM-SP2. The first and second substantially flat display portions or simply referred to herein as first and second flat display portion for ease of description.

The first flat display portion DM-CP1 has a shape corresponding to the first flat part WM-CP1 and is disposed under the first flat part WM-CP1. The first curved display portion DM-SP1 has a shape corresponding to the first bending part WM-SP1 and is disposed under the first bending part WM-SP1. The second curved display portion DM-SP2 has a shape corresponding to the second bending part WM-SP2 and is disposed under the second bending part WM-SP2. The second flat display portion DM-CP2 has a shape corresponding to the second flat part WM-CP2 and is disposed under the second flat part WM-CP2.

Similarly, the display module DM may be defined as one configuration in which the first flat display portion DM-CP1, the second flat display portion DM-CP2, the first curved display portion DM-SP1, and the second curved display portion DM-SP2 have an integral shape.

The cover layer CY is disposed under the display module DM and may support the display module DM. The cover layer CY may protect the display module DM from pressure or impact applied from the outside, and may absorb the internal heat of the display device DD. For example, the cover layer CY may include a material having high thermal conductivity. The cover layer CY may include a plurality of components, which will be described in more detail with reference to FIG. 5.

As mentioned above, through the first flat part WM-CP1 of the window WM corresponding to the front surface of the display device DD and the second flat part WM-CP2 of the window WM corresponding to the back surface of the display device DD, an image may be displayed. As such, as an image may be displayed through each of the front and rear surfaces of the display device DD and the window WM includes the first and second flat parts WM-CP1 and WM-CP2 disposed on the front and rear surfaces of the display device DD, respectively, at least a portion of the window WM may have a folded shape and/or a curved shape. For example, the first bending part WM-SP1 of the window WM has the folded shape and/or curved shape.

In addition, the first curved display portion DM-SP1 of the display module DM disposed under the first bending part WM-SP1 of the window WM may also have a folded shape and/or a curved shape. In this case, the cover layer CY disposed under the first curved display portion DM-SP1 of the display module DM may also have a folded shape and/or a curved shape.

The cover layer CY may include at least one support that may be in the form of a metal plate that supports the display module DM from the outside and protects the display module DM from external impact. In the case of a metal plate, folding and/or bending of the cover layer CY may not be easy as it is made of a rigid material.

According to an embodiment, the metal plate of the cover layer CY overlapping the first curved display portion DM-SP1 may have at least one discontinuity such as a plurality of holes to facilitate folding. For example, the holes may be through holes penetrating the metal plate, that is, openings. As a plurality of openings are defined on and/or in the metal plate of the cover layer CY overlapping the first curved display portion DM-SP1, folding of the cover layer CY may be easier.

Figure 4:
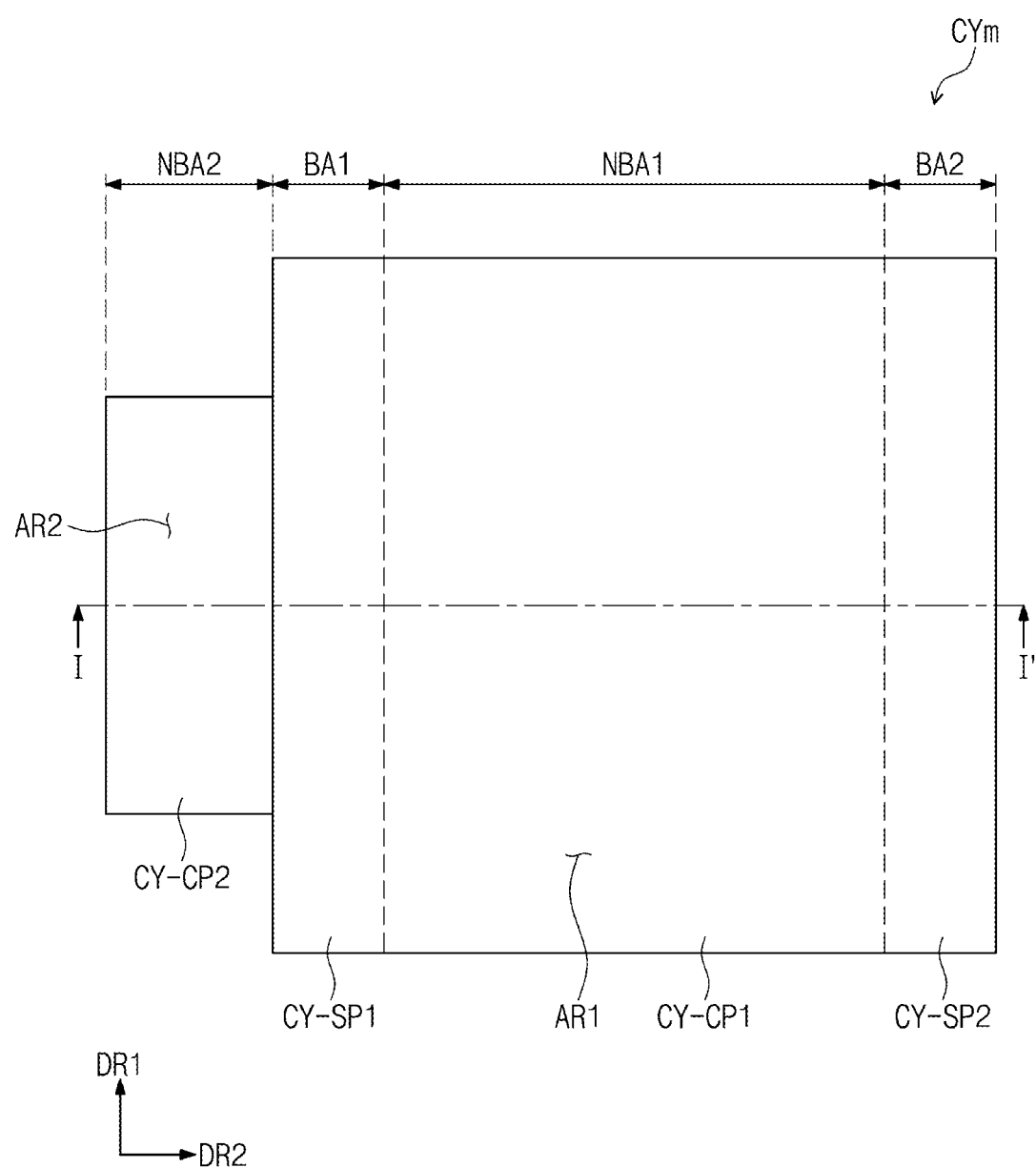
FIG. 4 is a plan view of an embodiment of the cover layer of FIG. 2 before molding the cover layer.
Figure 5:
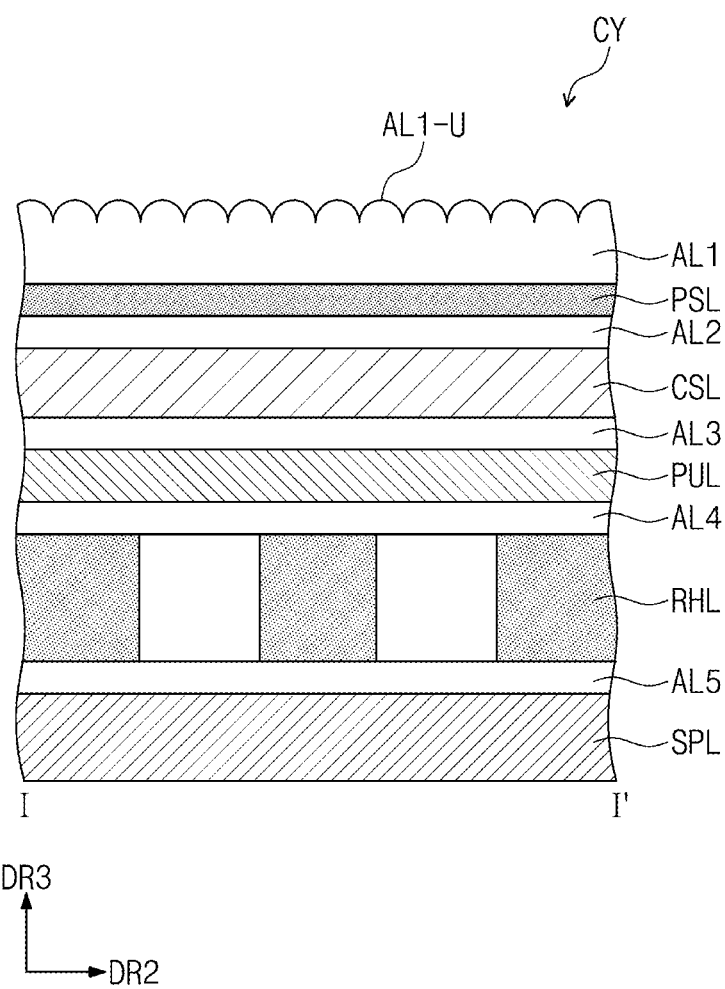
FIG. 5 is a cross-sectional view taken along line I-I' of FIG. 4.

FIG. 4 is a plan view of an embodiment of the cover layer of FIG. 2 before molding the cover layer. FIG. 5 is a cross-sectional view taken along line I-I' of FIG. 4.

Referring to FIG. 4, a cover layer CYm before molding is shown. That is, the cover layer CYm shown in FIG. 4 has a shape before the cover layer CY is molded and/or deformed as shown in FIG. 2.

The cover layer CYm includes a first cover part CY-CP1, a second cover part CY-CP2, a third cover part CY-SP1, and a fourth cover part CY-SP2. The first cover part CY-CP1 may correspond to the first planar area NBA1, and the second cover part CY-CP2 may correspond to the second planar area NBA2. The third cover part CY-SP1 corresponds to the first bending area BA1, and the fourth cover part CY-SP2 corresponds to the second bending area BA2.

On a plane, the first cover part CY-CP1 may have a larger area than the second cover part CY-CP2. That is, the first cover part CY-CP1 may support the first flat display portion DM-CP1 of the display module DM shown through FIG. 2, and the second cover part CY-CP2 may support the second flat display portion DM-CP2 of the display module DM shown through FIG. 2.

Referring to FIG. 5, the cover layer CY includes adhesive layers AL1 to AL5, one or more protective layers in the form of a first protective film PSL and a second protective film PUL, a cushion layer CSL, a heat radiation layer RHL, and a support plate SPL.

The adhesive layers AL1 to AL5 include a first adhesive layer AL1, a second adhesive layer AL2, a third adhesive layer AL3, a fourth adhesive layer AL4, and a fifth adhesive layer AL5. The adhesive layer AL1 to AL5 may be an Optically Clear Adhesive (OCA) film, an Optically Clear Resin (OCR), or a Pressure Sensitive Adhesive (PSA) film.

The first adhesive layer AL1 may define the uppermost layer of the cover layer CY. The upper surface AL1-U of the cover layer CY may face the display module DM shown in FIG. 2. In an embodiment, the upper surface AL1-U of the first adhesive layer AL1 may have a pattern shape such as a semi-circular shape that is repeatedly arranged in the first direction DR1 and/or the second direction DR2. For example, the upper surface AL1-U of the first adhesive layer AL1 may have a shape in which the pattern shape is repeated along the first direction DR1 and/or the second direction DR2.

The first protective film PSL may be disposed between the first adhesive layer AL1 and the second adhesive layer AL2. The first protective film PSL may prevent scratches from being generated on the rear surface of the display module DM during the manufacturing process of the display module DM. The first protective film PSL may be a colored polyimide film. For example, the first protective film PSL may be an opaque yellow film, but is not limited thereto.

The cushion layer CSL may be disposed between the second adhesive layer AL2 and the third adhesive layer AL3. The cushioning layer CSL may improve the impact resistance of the display device DD. For example, the cushion layer CSL may include foam or sponge. The foam may include a polyurethane foam or a thermoplastic polyurethane foam. In case where the cushion layer CSL includes foam, the cushion layer CSL may include a base layer. A foaming agent may be foamed on the base layer to form the cushion layer CSL.

The second protective film PUL may be disposed between the third adhesive layer AL3 and the fourth adhesive layer AL4. For example, the second protective film PUL may include a polyimide (Pl) film or a polyethylene terephthalate (PET) film. In the same manner, the second protective film PUL may prevent scratches from being generated on the rear surface of the display module DM during the manufacturing process of the display module DM.

The heat radiation layer RHL may be disposed between the fourth adhesive layer AL4 and the fifth adhesive layer AL5. In an embodiment, the heat radiation layer RHL may be a graphitized polymer film. The polymer film may be, for example, a polyimide film. However, the material of the heat radiation layer RHL is not limited thereto and may include other materials. For example, the heat radiation layer (RHL) may include graphite, aluminum (Al), nickel (Ni), platinum (Pt), silver (Ag), gold (Au), or a combination thereof. In an embodiment, the heat radiation layer RHL may have high thermal conductivity.

The support plate SPL may define a lowermost layer of the cover layer CY. The support plate SPL may be disposed under the fifth adhesive layer AL5 most distant from the display module DM. The support plate SPL may include a metal alloy, for example, a copper alloy. However, the material constituting the support plate SPL is not limited thereto. The support plate SPL generally supports the components of the cover layer CY, and may protect the display module DM from external impact.

The support plate SPL may correspond to the metal plate of the cover layer CY overlapping and/or disposed under the display module DM described above with reference to FIG. 2. To facilitate folding, at least a portion of the support plate SPL may have at least one discontinuity such as a plurality of holes and/or openings. For example, holes and/or openings may be defined in a portion of the support plate SPL overlapping the first curved display portion DM-SP1. As a result, a portion of the support plate SPL overlapping the first curved display portion DM-SP1 may be folded more easily.

While the configurations of the cover layer CY have been described through FIG. 5, embodiments are not limited thereto, and the structures and arrangement of the cover layer CY may be variously modified. For example, the cover layer CY may include additional components, or some of the components illustrated in FIG. 5 may be omitted.

Figure 6:
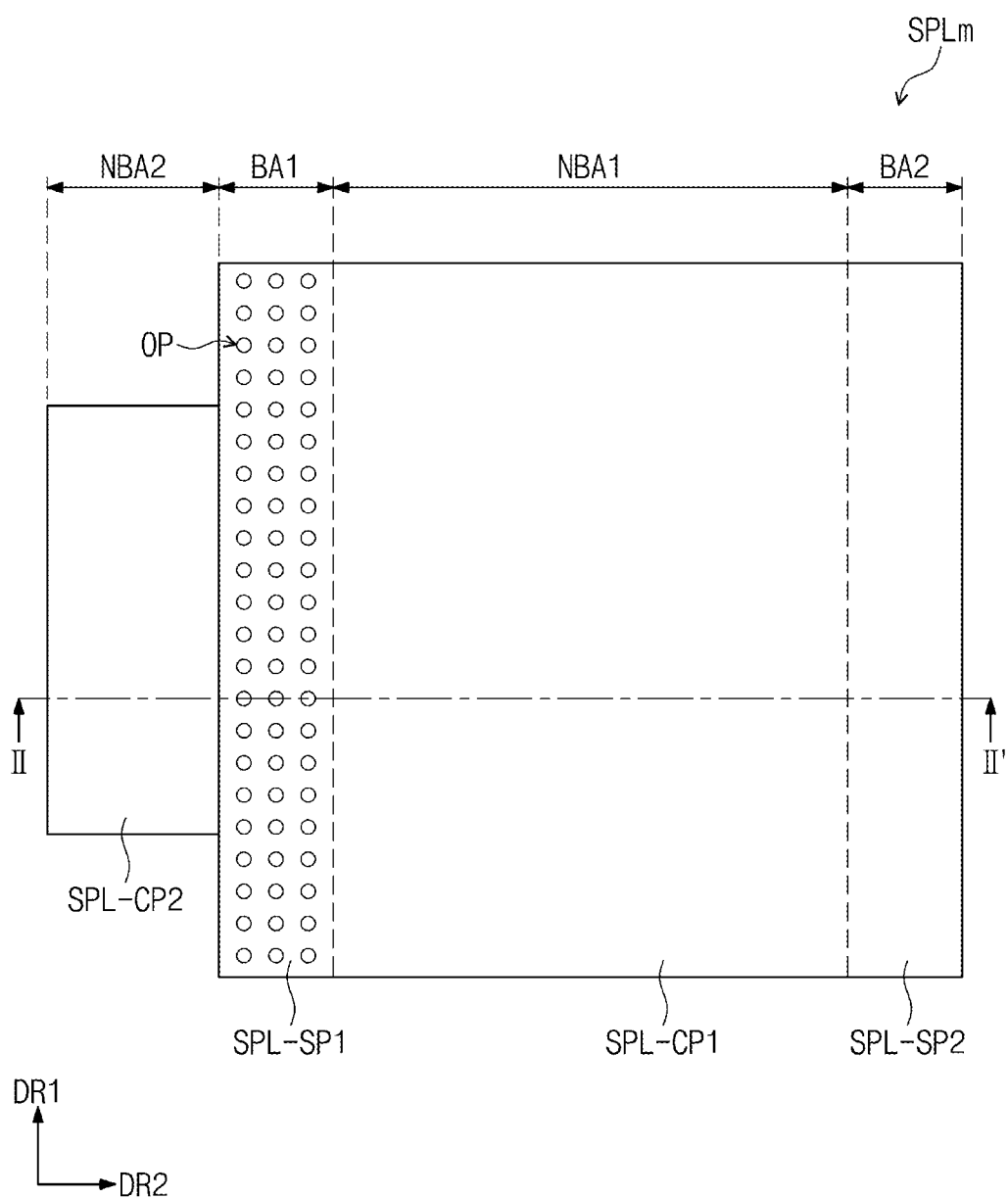
FIG. 6 is a plan view of an embodiment of the support plate of FIG. 5 before molding the support plate.
Figure 7A:
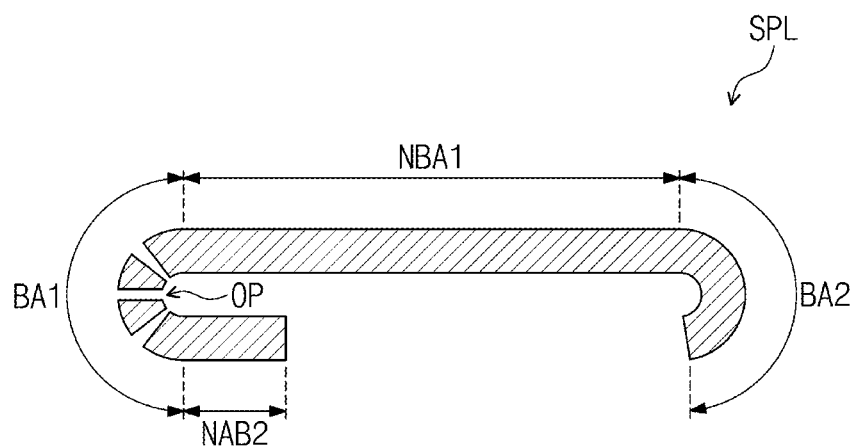
FIG. 7A is a cross-sectional view of an embodiment of the support plate taken along line II-II' of FIG. 6.
Figure 7B:
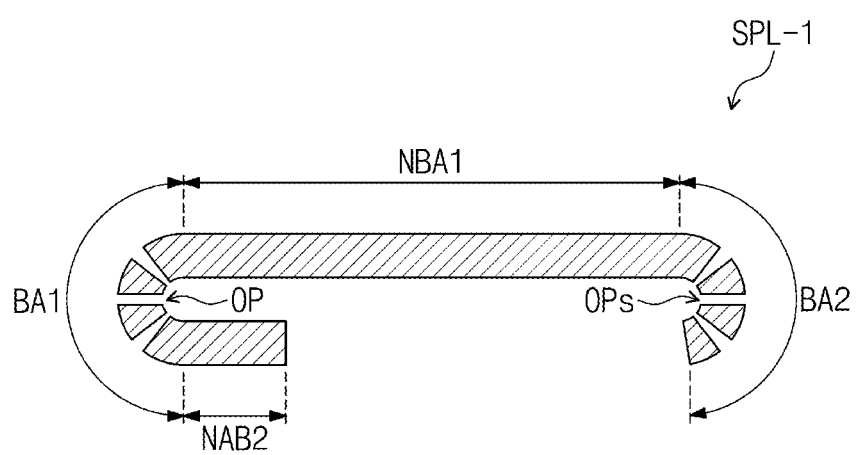
FIG. 7B is a cross-sectional view of another embodiment of the support plate taken along line II-II' of FIG. 6.

FIG. 6 is a plan view of an embodiment of the support plate of FIG. 5 before molding the support plate. FIG. 7A is a cross-sectional view of an embodiment of the support plate taken along line II-II' of FIG. 6. FIG. 7B is a cross-sectional view of another embodiment of the support plate taken along line II-II' of FIG. 6.

Referring to FIG. 6, a support plate SPLm before molding is shown. The support plate SPLm may correspond to a shape before the cover layer CY is molded and/or deformed as shown in FIG. 2.

The support plate SPLm includes a first plate part SPL-CP1, a second plate part SPL-CP2, a third plate part SPL-SP1, and a fourth plate part SPL-SP2. The first plate part SPL-CP1 may correspond to the first planar area NBA1, and the second plate part SPL-CP2 may correspond to the second planar area NBA2. The third plate part SPL-SP1 corresponds to the first bending area BA1, and the fourth plate part SPL-SP2 corresponds to the second bending area BA2.

After the support plate SPLm is molded and/or folded, the third plate part SPL-SP1 may have a curved shape and/or a folded shape, the first plate part SPL-CP1 and the second plate part SPL-CP2 face each other in the third direction DR3.

The third plate part SPL-SP1 having a folded shape and/or a curved shape may have a plurality of openings OP spaced from each other. As shown in FIG. 7A, the third plate part SPL-SP1 having the openings OP may have easier folding characteristics compared to other plate parts which does not have openings. The number and arrangement shape of the openings OP defined in the third plate part SPL-SP1 are not limited to as shown in FIGS. 6 and 7A, and may be variously modified.

Referring to FIG. 7B, a support plate SPL-1 may have a plurality of openings not only in the third plate part SPL-SP1 but also in the fourth plate part SPL-SP2. For example, openings OPs defined in the fourth plate part SPL-SP2 may have shapes corresponding to openings OP defined in the third plate part SPL-SP1.

Figure 8A:
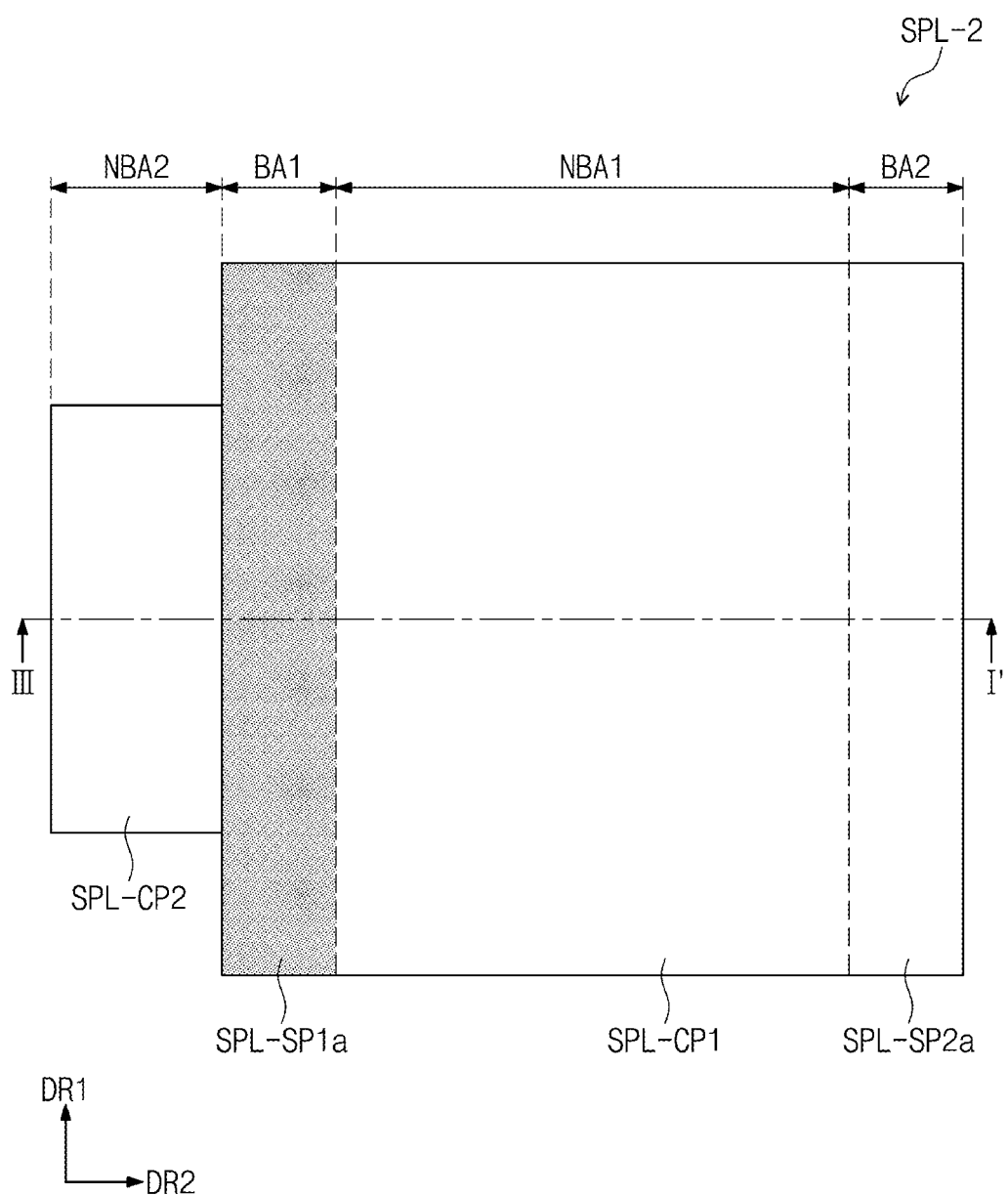
FIG. 8A is a plan view of another embodiment of the support plate of FIG. 5 before molding the support plate.
Figure 8B:
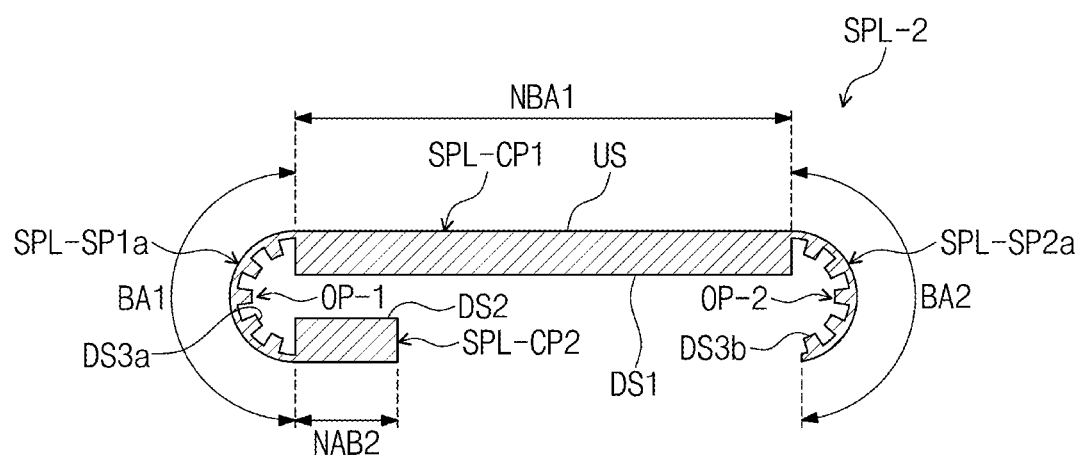
FIG. 8B is a cross-sectional view taken along line of FIG. 8A according to still another embodiment of the support plate.

FIG. 8A is a plan view of another embodiment of the support plate of FIG. 5 before molding the support plate. FIG. 8B is a cross-sectional view taken along line of FIG. 8A according to still another embodiment of the support plate.

Compared to the support plate SPL shown in FIG. 6, the structures of the third plate part SPL-SP1a and the fourth plate part SPL-SP2a are modified in the support plate SPL-2 shown in FIG. 8A, and the structure of the remaining components may be substantially the same. Hereinafter, repetitive descriptions will be omitted to avoid redundancy and the structures of a third plate part SPL-SP1a and a fourth plate part SPL-SP2a will be mainly described.

Referring to FIGS. 8A and 8B, the support plate SPL-2 includes an upper surface US and a lower surface. The upper surface US of the support plate SPL-2 is adhered to the fifth adhesive layer AL5 shown in FIG. 5, and the lower surface of the support plate SPL-2 may be exposed to the outside. As shown in FIG. 8B, the lower surface may include a first lower surface DS1 corresponding to the first plate part SPL-CP1, a second lower surface DS2 corresponding to the second plate part SPL-CP2, a third lower surface DS3a corresponding to the third plate part SPL-SP1a, and a fourth lower surface DS3b corresponding to the fourth plate part SPL-SPL2a.

According to an embodiment, the support plate SPL-2 may have one or more first recesses OP-1 on the third lower surface DS3a corresponding to the third plate part SPL-SP1a. As such, the third lower surface DS3a may include at least one discontinuity such as the first recesses OP-1 and uneven shapes without completely penetrating the body of the support plate SPL-2.

In addition, the support plate SPL-2 may have one or more second recesses OP-2 on the fourth lower surface DS3b corresponding to the fourth plate part SPL-SP2a. Similarly to the third lower surface DS3a, the fourth lower surface DS3b may include at least one discontinuity such as the second recesses OP-2 and uneven shapes without completely penetrating the body of the support plate SPL-2.

Figure 9A:
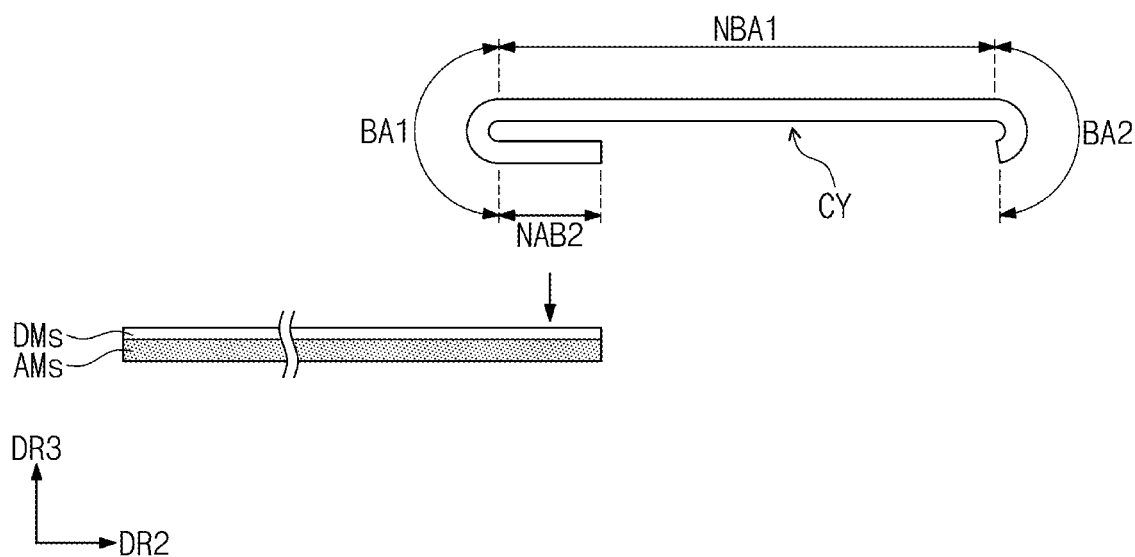
FIGS. 9A and 9B are cross-sectional views of elements of the display device to illustrate some of the processes of a method of manufacturing the display device according to the principles of the invention.
Figure 9B:
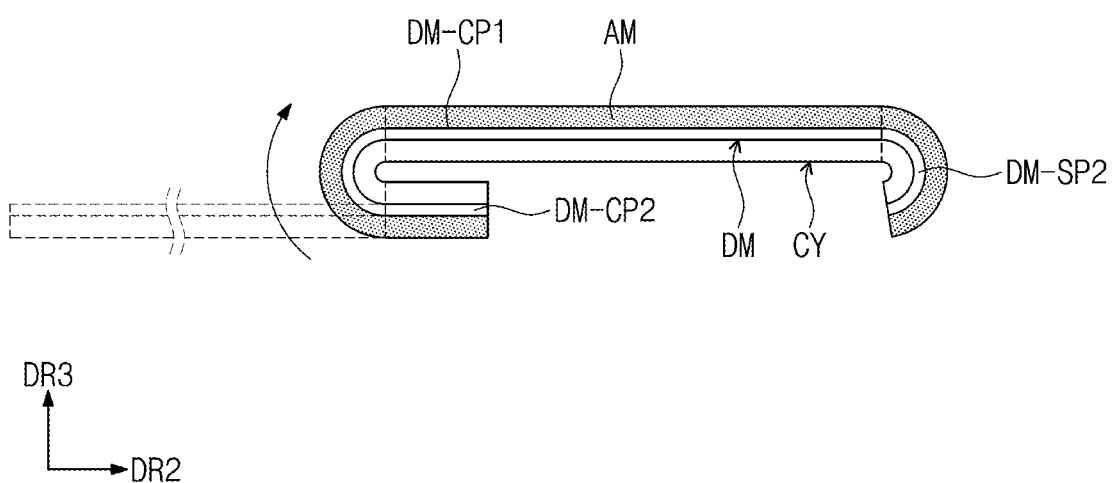

FIGS. 9A and 9B are cross-sectional views of elements of the display device to illustrate some of the processes of a method of manufacturing the display device according to the principles of the invention.

Referring to FIGS. 9A and 9B, the first planar area NBA1 and the second planar area NBA2 may face each other through the first bending area BA1 having the folded shape and/or curved shape. Due to this configuration, the space between the first planar area NBA1 and the second planar area NBA2 may be narrowed.

As a result, after the window WM and the display module DM are adhered to each other and bent, the process of forming the cover layer CY under the display module DM corresponding to the first planar area NBA1 and the second planar area NBA2 may be difficult. For example, in the process of forming the cover layer CY under the display module DM, a portion of the display module DM may be scraped and/or rubbed, which causes the display module DM to be damaged.

As illustrated in FIG. 9A, the cover layer CY having a shape corresponding to the display device DD illustrated in FIG. 2 may be provided. The cover layer CY may include the configurations described through FIG. 5, and may include the support plate SPL of FIG. 7A or the support plate SPL-1 of FIG. 7B. The display module DMs and adhesive layer AMs may have a substantially flat shape, which is the shape before molding.

As an example, as shown in FIGS. 6 and 7B, through the third plate part SPL-SP1 and the fourth plate part SPL-SP2 of the support plate SPL-1 including at least one opening, to facilitate folding of the corresponding cover layer CY. In other words, in the case of a structure having the improved folding characteristics of the third plate part SPL-SP1 and the fourth plate part SPL-SP2 of the support plate SPL, which is a metallic material, the ease of folding of the cover layer CY corresponding thereto is facilitated and/or improved.

The display module DMs and adhesive layer AMs may be formed on the molded cover layer CY. In this case, the display module DMs and the adhesive layer AMs can better maintain their bonded condition.

As shown in FIG. 9A, a portion of the display module DMs and a portion of the cover layer CY corresponding to the second planar area NBA2 may be aligned to face each other. Thereafter, a portion of the display module DMs may be formed on the cover layer CY corresponding to the second planar area NBA2. Actually, a portion of the display module DMs is disposed on the first adhesive layer AL1 of the cover layer CY illustrated in FIG. 5, and the display module DMs and the cover layer CY may be bonded through the first adhesive layer AL1.

Thereafter, the remainder of the display module DMs may be formed on and/or coupled to the cover layer CY through a rolling operation or the like. The display module DMs may be rolled on the cover layer CY to couple the remainder of the display module DMs to other portions of the cover layer CY corresponding to the first bending area BA1, the first planar area NBA1, and the second bending area BA2. The adhesive layer AMs, which is disposed on the display module DMs, may be formed on the cover layer CY together with the display module DMs.

As a result, as shown in FIG. 9B, an adhesive layer AM, a display module DM may be provided on the cover layer CY. Also, the window WM shown in FIG. 2 may be bonded to the display module DM through the adhesive layer AM. In this case, the window WM may have a substantially rigid property. As a result, the window WM may have a pre-molded shape through a separate jig.

As such, as the display module DM is formed on the pre-molded cover layer CY, the damage such as scratching may be prevented when the cover layer CY and the display module DM are bonded together.

Figure 10A:
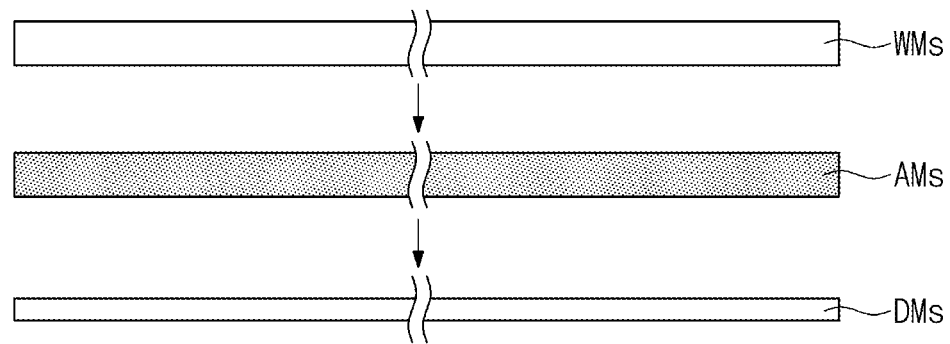
FIGS. 10A and 10B are cross-sectional views of elements of the display device to illustrate some of the processes of a method of manufacturing the display device according to the principles of the invention.
Figure 10B:
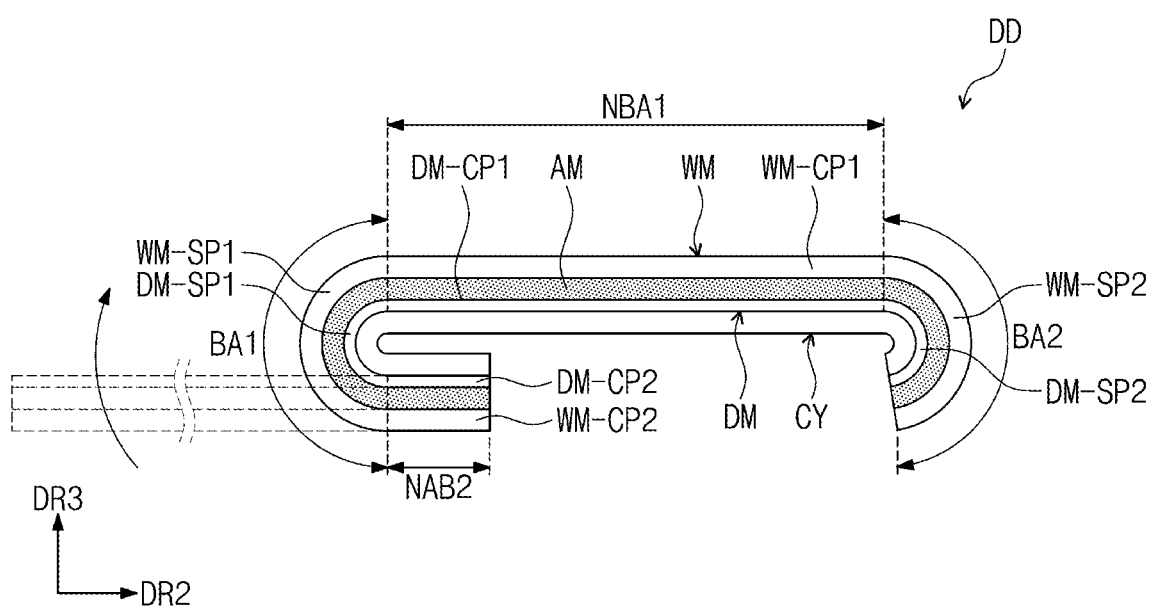

FIGS. 10A and 10B are cross-sectional views of elements of the display device to illustrate some of the processes of a method of manufacturing the display device according to the principles of the invention.

Referring to FIG. 10A, a window WMs, an adhesive layer AMs, and a display module DMs, which is not molded, are provided. Each of the window WMs, the adhesive layer AMs, and the display module DMs may have a planar shape before molding. Also, the window WMs and the display module DMs may have a shape bonded to each other through the adhesive layer AMs.

Thereafter, a portion of the display module DMs and a portion of the cover layer CY corresponding to the second planar area NBA2 may be aligned to face each other. Thereafter, the portion of the display module DMs may be formed on and/or coupled to the portion of the cover layer CY corresponding to the second planar area NBA2.

Thereafter, the remainder of the display module DMs may be formed on and/or coupled to the cover layer CY through a rolling operation or the like. The adhesive layer AMs and window WMs, which is disposed on the display module DMs, may be formed on the cover layer CY together with the display module DMs.

As a result, as illustrated in FIG. 10B, an adhesive layer AM, a display module DM, and a window WM may be provided on the cover layer CY. In this case, the window WM may be provided as a synthetic resin film having flexible properties. For example, the window WM may include a polyimide (PI) film or a polyethylene terephthalate (PET) film. In addition, the window WM may be provided with an ultra thin glass (UTG) that is easily folded.

Although certain embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. A display device comprising:
   a display module including a first substantially flat portion, a first curved portion bent from one portion of the first substantially flat portion, and a second substantially flat portion facing the first substantially flat portion in a thickness direction of the first substantially flat portion; and
   a cover member comprising a support to support the display module, the support including a first part disposed under the first substantially flat portion, a second part disposed under the second substantially flat portion, and a third part disposed under the first curved portion,
   wherein:
   the third part of the support has at least one discontinuity comprising a circularly-shaped hole at least partially penetrating the third part of the support; and
   the cover member comprises a cover layer including:
      an adhesive layer disposed between the support and the display module and comprising a first adhesive layer, a second adhesive layer, a third adhesive layer, a fourth adhesive layer, and a fifth adhesive layer;
      a cushion layer disposed directly between the second adhesive layer and the third adhesive layer;
      a first protective film disposed directly between the first adhesive layer and the second adhesive layer;
      a second protective film disposed directly between the third adhesive layer and the fourth adhesive layer; and
      a heat radiation layer disposed directly between the fourth adhesive layer and the fifth adhesive layer;
      wherein the first to the fifth adhesive layers are sequentially arranged in the direction from the display module to the support,
      and
   an upper surface of the first adhesive layer has a shape in which a semicircular pattern is repeatedly arranged.

2. The display device of claim 1, wherein the third part of the support has a curved shape corresponding to the first curved portion.

3. The display device of claim 1, wherein the first substantially flat portion has a larger area than the second substantially flat portion.

4. The display device of claim 1, wherein the support is spaced apart from the display module at a greater distance than any of the layers of the cover layer.

5. The display device of claim 1, wherein the support comprises a metal material.

6. The display device of claim 1, wherein each of the first substantially flat portion, the second substantially flat portion, and the first curved portion includes a display area to display an image and a peripheral area adjacent to the display area.

7. The display device of claim 1, wherein the display module further includes a second curved portion bent from another portion of the first substantially flat portion and facing the first curved portion in one direction,
   wherein the support further includes a fourth part disposed under the second curved portion and corresponding to a shape of the second curved portion.

8. The display device of claim 7, wherein the fourth part of the support includes one or more discontinuities spaced apart from each other.

9. The display device of claim 7, wherein the first to fourth parts of the support are integrally formed into a unitary shape.

10. A method of manufacturing a display device, the method comprising steps of:
   providing a cover member including a support and having a folded shape and rigid form, a first substantially flat part and a second substantially flat part facing each other in a thickness direction, and a curved part between one end of the first part and one end of the second part having at least one discontinuity;

providing an adhesive layer and a display module to be bonded to the adhesive layer, each of the adhesive layer and the display module having a substantially flat shape; and forming the display module on the cover member such that the display module and the adhesive layer each has a folded shape corresponding to the folded shape of the cover member, wherein the adhesive layer comprising a first adhesive layer, a second adhesive layer, a third adhesive layer, a fourth adhesive layer, and a fifth adhesive layer, wherein the cover member further comprising a cover layer including:
a cushion layer disposed directly between the second adhesive layer and the third adhesive layer;
a first protective film disposed directly between the first adhesive layer and the second adhesive layer;
a second protective film disposed directly between the third adhesive layer and the fourth adhesive layer; and
a heat radiation layer disposed directly between the fourth adhesive layer and the fifth adhesive layer;

wherein the first to the fifth adhesive layers are sequentially arranged in the direction from the display module to the support, and wherein an upper surface of the first adhesive layer has a shape in which a semicircular pattern is repeatedly arranged.

11. The method of claim 10, further comprising steps of bonding a window having a shape corresponding to the cover member and the adhesive layer to the display module.

12. The method of claim 10, further comprising steps of forming a window on the adhesive layer by forming the display module, the adhesive layer, and the window on the cover member such that the window has a shape corresponding to the shape of the cover member.

13. The method of claim 10, wherein the step of forming the display module on the cover member comprises steps of:
aligning a portion of the display module with the second substantially flat part of the cover member;
coupling the aligned portion of the display module to the second substantially flat part of the cover member; and
coupling other portion of the display module to the curved part and the first substantially flat part of the cover member.

* * * * *